Feb. 15, 1966
G. SCOURTES
3,235,715
LOW FREQUENCY COUNTER
Filed July 30, 1962
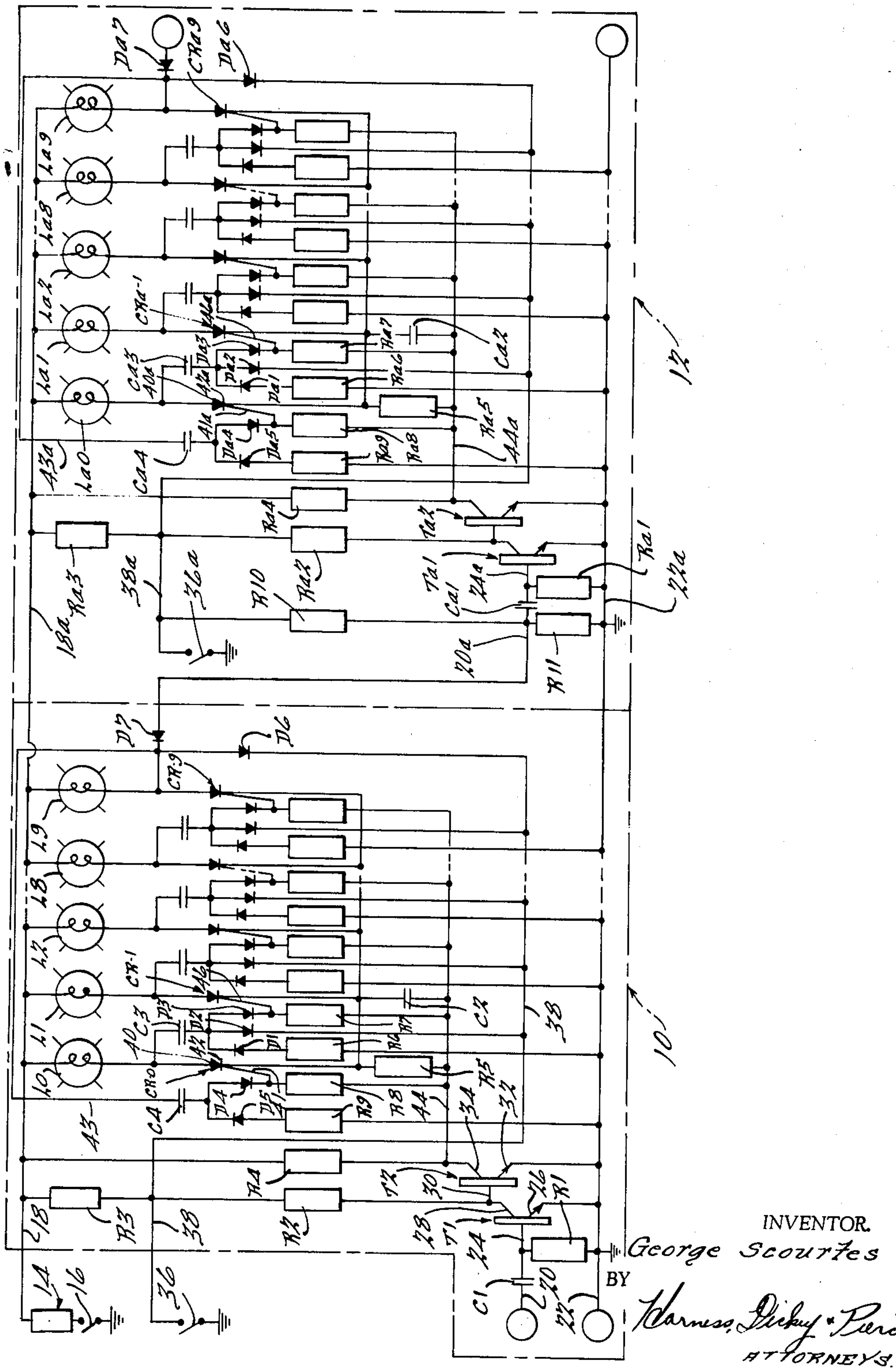
INVENTOR.
George Scourtes
BY
Harness, Dickey & Pierce
ATTORNEYS.

United States Patent Office 3,235,715

Patented Feb. 15, 1966

3,235,715

LOW FREQUENCY COUNTER

George Scourtes, Detroit, Mich., assignor to Cox Instruments Corporation, a corporation of Michigan Filed July 30, 1962, Ser. No. 213,215

24 Claims. (Cl. 235—92)

This invention relates to sequentially operative electrical actuating circuits and more particularly to electronic counters.

Electronic counters operate in response to an electrical trigger signal indicating the occurrence of some event to be counted. In order for conventional electronic counter circuitry to function properly, the pulse width of the signal must be controlled, i.e., the width must be less than a given minimum to be effective. For relatively low frequency counting applications the above requirement of conventional electronic counter circuitry poses difficulties since the pulse must be shaped, etc. in order to be of the proper width. It is an object of this invention to provide an electronic counter responsive to a trigger signal the width of which need not be critically controlled.

Many conventional electronic counters have circuitry which operate on a binary or other type coded system. It is an object of this invention to provide a simple electronic counter circuit operating on a direct decimal system.

While this invention is described as embodied in a decimal counter having more than one decimal stage, the circuitry of this invention is readily adaptable for use in the successive energization or actuation of a plurality of electrical devices other than counter indicators. Therefore, it is another object of this invention to provide a novel circuit which is actuable responsively to successive trigger pulses of a noncritical width for successively actuating a plurality of circuits.

The operation of the circuitry of this invention is cyclical in that, upon actuation of the last of a plurality of circuits, a next trigger pulse causes actuation of the first of the plurality of circuits and thus initiates a repetition of the cycle. Therefore it is an object of this invention to provide a novel circuit which is actuable responsively to successive trigger pulses of a non-critical width for successively actuating a plurality of circuits and which is actuable for continuously repeating the successive actuation of the plurality of circuits responsively to additional, successive trigger pulses.

Other objects, features, and advantages of the present invention will become apparent from the subsequent description and the appended claims, taken in conjunction with the accompanying drawings, in which:

FIGURE 1 is an electric schematic diagram depicting two stages of a computor embodying the features of this invention.

In the computor circuit shown controlled rectifiers are utilized; controlled rectifiers are semi-conductor devices which are similar in operation to a thyratron in that, with the anode being at a predetermined positive potential with respect to the cathode of the rectifier, a current flow above a critical level through a gate electrode of the rectifier essentially "turns on" the rectifier allowing conduction between anode and cathode. This conduction can be interrupted only by removing the potential between the anode and cathode which is similar to the operation of a thyratron which has once fired.

Looking now to FIGURE 1, two stages 10 and 12 (indicated by dotted lines) represent two stages of a counter embodying the features of this invention. For purposes of example, the counter stage 10 is a 1's counter providing an indication from 0 to 9 while the stage 12 is a 10's counter providing an indication from 10 to 90. Additional counters could be provided, i.e., 100's, 1000's, depending upon the requirements of the particular application.

A power supply 14 of a conventional construction provides a D.C. output when the normally opened switch 16 is closed. The positive side of the output from the power supply 14 is connected directly to a conductor 18 in the first counter stage 10. The other end of the power supply 14 is connected to ground as indicated. The input trigger signal or pulse to be counted is applied between an input conductor 20 and a conductor 22 connected to ground. The trigger signal is thence fed to a base electrode 24 of a transistor T1 via a coupling capacitor C1. An input resistor R1 is connected from the base 24 of transistor T1 to ground conductor 22. Transistor T1 is an NPN type and has its emitter electrode 26 connected to the ground conductor 22 and has its collector electrode 28 connected to conductor 18 via a pair of serially connected load resistors R2 and R3. The collector 28 of transistor T1 is in turn connected directly to a base electrode 30 of an output transistor T2, of the NPN type, which has its emitter 32 connected directly to ground and has its collector 34 connected to the conductor 18 via a load resistor R4. A normally opened reset button 36 has one side connected to ground and has its other side connected between resistors R2 and R3 via a conductor 38 and serves a purpose to be presently seen.

The transistor T1 is normally "off" or non-conducting while transistor T2 is normally "on" or conducting. Upon the impression of a positive input or trigger pulse between conductors 20 and 22, the transistor T1 is rendered conductive thus dropping the potential of the base 30 of transistor T2, thereby temporarily terminating current flow through the collector 34 and emitter 32 of the transistor T2.

The first stage 10 of the computer has 10 lights designated by the number L0–L9, all of which have one end of their filaments connected to the hot conductor 18. Looking now to the circuitry associated with the light L0, the other, opposite end of the filament is connected to the anode 40 of a controlled rectifier CR–0. The controlled rectifier CR–0 is of the type previously described and has its cathode 42 connected directly to a biasing network comprised of resistor R5 connected in parallel with a capacitor C2. The other end of the biasing network is connected to the collector 34 of transistor T2 via a conductor 44. The potential developed across the biasing network is not critical and is provided for temperature compensation of the controlled rectifier CR–0. The gate electrode 41 of the controlled rectifier CR–0 is electrically connected in a manner to be described.

A control capacitor C3 has one end connected directly to the anode 40 of controlled rectifier CR–0 and has its other end connected directly to the cathode of a diode D1 and also to the anodes of diodes D2 and D3. The anode of the diode D1 is connected to the ground conductor 22 via a load resistor R6 while the cathode of the diode D2 is connected to reset switch 36 via conductor 38 and the cathode of diode D3 is connected to the collector 34 of transistor T2 via a load resistor R7 and the conductor 44. Since similar circuitry (see FIGURE 1) is provided for the circuits related to lights L1–L8, that circuitry will not be described here.

The gate electrodes of successive ones of the lights L0–L9 are connected to circuits associated with the preceding one of the lights L0–L9. For example, in the circuit associated with the light L1, a control rectifier CR–1 has its gate electrode 46 connected directly to the cathode of the diode D3 in the circuitry for the light L0. The circuitry for the lights L0–L9 are similarly interconnected and operate in a manner to be described.

The gate electrode 41 of the controlled rectifier CR–0 has one end connected to the cathode of a diode D4, and is thence connected via a resistor R8 to the conductor 44 and thence to the collector 34 of transistor T2. The anode of the diode D4 is connected directly to the cathode of a diode D5 which has its anode connected directly to ground via a load resistor R9. The anode of diode D4 and the cathode of diode D5 are commonly connected to the opposite or low voltage side of the filament of the light L9 via a capacitor C4 and conductor 43. The low voltage side of the filament of light L9 is connected to the anode of a diode D6 which has its cathode connected directly to the conductor 38 and thence to switch 36.

The operation of the first stage 10 will now be described. The switch 16 is first closed thereby energizing the conductor 18. A time delay built into the power supply 14 provides that the potential on the line 18 is slowly and gradually increased to full voltage in order to prevent the flow of excessive charge current to any of the capacitors described. A charge is applied to capacitor C3 through the circuit composed of the filament of lamp L0 and conductor 18 and diode D3, resistor R7, conductor 44, and the collector 34 and emitter 32 of transistor T1. In like manner a charge is applied to capacitors similar to capacitor C3 and associated with the circuitry of lights L1–L8. The capacitor C4 has the same circuit relationship to light L9 as capacitor C3 has to light L0 and is charged through similar circuitry, i.e., L9, D4, R8 and T2. At the same time a positive potential is applied across the anodes and cathodes of all the controlled rectifiers CR–0—CR–9; these rectifiers remain nonconductive since the predetermined minimum current flow through the associated gate is not exceeded. The transistor T1 is nonconductive and the transistor T2 is conductive.

In order to ready the first stage 10 for operation, the reset switch 36 is closed thereby placing the conductor 38 at ground potential. With the conductor 38 grounded, the capacitor C4 is discharged through the diode D6 to ground via conductor 38. The return discharge path of capacitor C4 is completed through the diode D5 and the resistor R9; the resistor R9 prevents the discharge current from being excessive. At the same time with the switch 36 closed, the capacitor C3 is charged through the circuit comprising the conductor 18, the filament of light L0 and the diode D2, conductor 38, and switch 36; likewise, similar charge circuits to all of the capacitors similar to C3 associated with the circuitry of the other lights L1–L8 are completed. As previously noted, after switch 16 is initially closed all of the capacitors similar to C3 (including C4) are charged; thus upon initially closing reset switch 36 no charge current flows to these capacitors. As will be seen during operation one of these capacitors may be in a discharged condition depending on the condition of the counter at that time; in order to clear the counter the reset switch 36 is closed causing that discharged capacitor to be charged and thereby placing the counter in a condition to count from zero again.

With conductor 38 grounded, transistor T2 is rendered nonconductive, thereby substantially removing the difference in potential from across each of the controlled rectifiers CR–0—CR–9. Initially this is of no significance since none of the rectifiers will at that time be conductive; however, if the counter has been operative and is now to be cleared to prepare for counting from zero again, that one of the rectifiers CR–0—CR–9 which is in a conductive state will be rendered nonconductive. Upon opening the reset switch 36 the conductor 38 is ungrounded and transistor T2 is rendered conductive again; the capacitor C4 is charged through the circuit comprised of the conductor 18, the filament of the lamp L9, the conductor 43 and through the diode D4, the load dropping resistor R8 and transistor T2; with the charge current flowing through resistor R8, the potential at the cathode side of the diode D4 is caused to increase, causing an increase in potential of gate 41 relative to the cathode 42 of the controlled rectifier CR–0, thereby causing current to flow through that circuit. At this time a positive potential is impressed across the controlled rectifier CR–0 via the conductor 18, the filament of the lamp L0 and via the conductor 44, the biasing circuit of R5 and C2, and the collector 34 and emitter 32 of the transistor T2 (which is now conductive). Under these conditions, with the current through the gate 41 exceeding a predetermined minimum, the controlled rectifier CR–0 is turned on, thereby allowing current to flow through the anode 40 to the cathode 42. As previously mentioned, the controlled rectifier CR–0 is similar in operation to a thyratron such that, once the controlled rectifier has been turned on, current will continue to flow until the potential difference between the anode 40 and cathode 42 is reduced to substantially zero. Thus, even though the charge current to the capacitor C4 eventually diminishes to zero the controlled rectifier CR–0 continues to conduct as described.

With the circuit now completed through the controlled rectifier CR–0 the capacitor C3 discharges through the controlled rectifier CR–0; the diode D1 provides a return path with the resistor R6 limiting the discharge current. The light L0 is now lit and the first stage 10 is now ready to receive the input or trigger signal.

Upon application of a positive input signal between the conductors 20 and 22, the base of the transistor T1 is made more positive thereby causing transistor T1 to conduct; this results in lowering the potential of the base 30 of the transistor T2 thereby cutting off current flow through the collector 34, emitter 32 of the transistor T2. With T2 off the potential of the conductor 44 is raised, since the path to ground via the transistor T2 is opened, resulting in the potential difference across the controlled rectifier CR–0 being moved to substantially zero. With the potential substantially removed from rectifier CR–0 conduction therethrough ceases. At the termination of the input or trigger signal the transistor T1 is again placed in an "off" condition since the base 24 returns to its normally more negative condition. With T1 non-conductive the potential of the base 30 of the transistor T2 is raised thus placing the transistor T2 in a state of conduction and thus lowering the potential of the conductor 44. However, the controlled rectifier CR–0 has been cut off; current flow will not be reinitiated therethrough even though a difference in potential appears across the anode 40 and cathode 42. At this time the capacitor C3 which has been discharged begins to charge and a charge current flows via the conductor 18, the filament of the lamp L0 and via the diode D3 and the load resistor R7. The charge current through resistor R7 causes the potential of the gate 46 relative to the cathode of the controlled rectifier CR–1 to be increased, causing current to flow therethrough. This current flow causes the controlled rectifier CR–1 to conduct thus causing current to flow through the light L1 turning that light on. Thus with the first pulse applied between the conductors 20 and 22 the light L1 has been lit. The light L0 has been extinguished and the remainder of the lights in the first stage 10 are off. It can be seen that with successive trigger pulses appearing between the conductors 20 and 22, a similar sequence occurs causing subsequent lights L2–L9 to be lit.

When the light L9 is lit, i.e., the controlled rectifier CR–9 is conducting, the capacitor C4 is then free to discharge through the controlled rectifier CR–9 to ground; a return path is provided by means of the diode D5 and resistor R9, with the resistor R9 limiting the discharge current. Thus upon the application of an additional trigger pulse to the input conductors 20 and 22 a similar sequence of events as previously described occurs in which the controlled rectifier CR–9 is extinguished and in which charge current flows to the capacitor C4 through the diode D4 thus again lighting L0 and thus placing the first stage 10 in a condition to repeat the sequence just described. Thus one cycle of the first stage 10 has been completed.

Note that all of the controlled rectifiers CR–0—CR–9 are connected to the biasing circuit comprised of the resistor R5 and the capacitor C2 which circuit thereby provides temperature compensation for all of these rectifiers. Thus as long as the first stage 10 is operative a temperature compensating bias voltage will be provided since at least one of the lights L0–L9 will be lit and hence at least one of the controlled rectifiers will be conducting.

While it has been mentioned that a positive trigger signal is applied between the conductors 20 and 22 it is to be understood that the circuitry could be readily revised whereby the counter circuit would be responsive to a negative input or trigger signal.

Note that it is the charge current to those capacitors similar to capacitor C3 which causes the next controlled rectifier and light to be actuated. Thus it is important that the change be maintained on these capacitors such that a charge current be provided only under the desired conditions. Each of these capacitors is maintained charged by means of current from the conductor 18 through the respective filament of the light with which it is associated; for example, with capacitor C3, charge current flows through the filament of the light L0 to the capacitor C3 through the diode D3, resistor R7 and thence to ground through the transistor T2. Note that the trickle charge current while sufficient to maintain a charge on capacitor C3 is not sufficient to cause an appreciable voltage drop across the resistor R7 and hence to cause current to flow through the gate of the succeeding controlled rectifier.

In the circuitry for the other lights L1–L9, the diodes similar to diode D1 provide a path for the discharge of the capacitors similar to the capacitor C3 through the associated controlled rectifier upon its conduction. The diodes similar to the diode D2 provide a circuit for charging the capacitors similar to the capacitor C3 upon closing the reset switch 36. The diodes similar to the diode D3 provide a path for charging the capacitors similar to the capacitor C3 after cessation of current flow through the associated controlled rectifier. The resistor R3 disposed between the conductor 18 and the conductor 38 provides a means of limiting the current from the power supply 16 upon closing of the reset switch 36 to place the first stage 10 in condition for operation.

Thus the operation of a first stage 10 has been explained in which sequential counting from 0 to 9 has been provided. The second stage 12 represents a 10's counter which is to be actuated each time a complete sequence of the counters in the first stage 10 has been completed. The circuitry of the second stage 12 is similar to that of the first stage 10 and similar components performing similar functions are given identical numbers with the subscript "*a*" added.

The ground conductor 22 of first stage 10 is connected to conductor **22*a* of the second stage 12 while the conductor 18 is connected to conductor 18*a*. A diode D7 has its cathode connected directly to the low voltage side of the light L9 and has its anode connected directly to the input conductor 20*a* which is connected to a base electrode 24*a*** of a transistor T*a*1 via a coupling capacitor C*a*1. The base electrode **24*a*** is connected directly to ground via a load resistor R*a*1. The transistor T*a*1 is interconnected to the transistor T*a*2 in a manner similar to the interconnection between transistors T1 and T2 of first stage 10 previously described and will not be described here in detail. The reset switch **36*a* is gauged with switch 36 for simultaneous operation therewith and is connected to circuitry similar to that of switch 36 by means of the conductor 38*a***. A load resistor R*a*3 is connected between the positive terminal **18*a* and the conductor 38*a* and thence to a voltage divider circuit comprising a first resistor R10, connected between conductors 38*a* and 20*a*, and a second resistor R11, connected from conductor 20*a* to ground conductor 22*a*. The operation of the second stage 12 is similar to that of the first stage 10 and thus upon closing and opening the reset switch 36*a*, simultaneously with the reset switch 36**, the light L*a*0 is caused to be lit as a result of the conduction of its associated controlled rectifier CR*a*–0. The circuitry of second stage 12 is now in condition for operation.

With the lamp L9 of first stage 10 off, the positive potential of the conductor 18 appears at the cathode of the diode D7, thus preventing current flow therethrough. In the meantime, the transistor T*a*1 is non-conductive since the base **24*a*** is essentially connected to ground via the resistor R*a*1; the coupling capacitor C*a*1 isolates the base **24*a*** from the positive D.C. potential appearing across the voltage divider network comprising resistors R10 and R11. When the light L9 is turned on through the conduction of current through the controlled rectifier CR–9, the potential at the low voltage side of the light L9 and hence of the cathode of the diode D7 instantaneously drops thus allowing the capacitor C*a*1 to be discharged through the diode D7, the controlled rectifier CR–9, and thence to ground. With the next trigger pulse to the input conductors 20 and 22 of the first stage 10, the light L9 is extinguished thereby terminating current flow through the diode D7 and thus allowing a charge current to flow to the capacitor C*a*1 and through the resistor R*a*1. The current through R*a*1 causes the potential of the base **24*a*** to be raised causing the transistor T*a*1 to conduct. This results in a termination of the conduction of the transistor T*a*2 causing a sequence of operations similar to that previously described, whereby the lamp L*a*0 is extinguished and the lamp L*a*1 (corresponding to the count of 10) be turned on. Actuation of the succeeding lights L*a*2–L*a*9 occurs in a similar manner as described with reference to the first stage 10 except, of course, that lights L*a*2–L*a*9 are actuated only after each cycle of the first stage 10.

By using the diode D7 along with the voltage divider comprised of the resistors R10 and R11 possible double pulsing of the transistor T*a*1 is prevented. For example, the capacitor C*a*1 will usually be fully charged and have pulsed the second stage 12 before charge current can flow to capacitor C4. As capacitor C4 is being charged a voltage drop occurs across the filament of the light L9 dropping the potential at the low voltage side; without the diode D7 and the voltage divider network, the capacitor C*a*1 would discharge because of the drop in potential and hence upon recharge provide a second pulse to trigger the second stage 12. The voltage divider circuit comprised of resistors R10 and R11 biases the diode D7 so that the slight potential drop across L9 in charging capacitor C4 is not sufficient to render D7 conductive and hence discharge C*a*1.

From the above discussion it can be seen that the width of the pulse or trigger signal applied to input conductors 20 and 22 is not critical and will actuate the counter circuit regardless of extreme variations in width.

While it will be apparent that the preferred embodiments of the invention disclosed are well calculated to fulfill the objects above stated, it will be appreciated that the invention is susceptible to modification, variation and change without departing from the proper scope or fair meaning of the subjoined claims.

What is claimed is:

1. An electrical actuating circuit operable for controlling the application of an electrical potential from a source responsively to a trigger signal comprising control circuit means for providing a control signal responsively to reception of the trigger signal, asymmetric switch means for conducting current from the source and including a normally opened output circuit electrically connected to the source for conducting current therefrom upon being closed and electrically connected to said control circuit means for opening said output circuit responsively to said control signal and further including an input circuit for closing said output circuit responsively to the application of an input signal, output signal means electrically connected to said output circuit of said switch means for providing an output signal responsively to said output circuit being opened, electrical circuit means electrically connected to said output signal means and to said control signal means and being placed in a first condition responsively to reception of said control signal and in a second condition responsively to reception of said output signal, and input signal means electrically connected to said electrical circuit means for providing said input signal to said input circuit of said switch means responsively to said electrical circuit means being placed in said one condition.

2. An electrical circuit operable for controlling the application of an electrical potential from a source responsively to a trigger signal comprising control circuit means for providing a control signal responsively to reception of the trigger signal, asymmetric switch means for conducting current from the source and including a normally opened output circuit electrically connected to the source for conducting current therefrom upon being closed and electrically connected to said control circuit for being opened responsively to said control signal and further including an input circuit for closing said output circuit responsively to the application of an input signal, output signal means electrically connected to said output circuit of said switch means for providing an output signal and including first energy storage means for providing said output signal in accordance with a change in its energy storage condition and for changing its energy storage condition responsively to said output circuit of said switch means being opened, electrical circuit means electrically connected to said output signal means and to said control means and being placed in a first condition responsively to reception of said control signal and in a second condition responsively to reception of said output signal, input signal means electrically connected to said electrical circuit means for providing said input signal to said input circuit of said switch means and including second energy storage means for providing said input signal in accordance with a change in its energy storage condition and for changing its energy storage condition responsively to said electrical circuit means being placed in said first condition.

3. An electrical actuating circuit operable for controlling the application of an electrical potential from a source responsively to a trigger signal comprising control circuit means for providing a control signal responsively to reception of the trigger signal, first asymmetric switch means for conducting current from the source and including a normally opened output circuit electrically connected to the source for conducting current therefrom upon being closed and electrically connected to said control circuit for being opened responsively to said control signal and further including an input circuit for closing said output circuit responsively to the application of an input signal, output signal means electrically connected to said output circuit of said first switch means for providing an output signal and including first energy storage means for providing said output signal in accordance with a change in its energy storage condition and for changing its energy storage condition responsively to said output circuit of said first switch means being opened, second asymmetric switch means for conducting current from the source and including a normally opened output circuit electrically connected to the source for conducting current therefrom upon being closed and electrically connected to said control means for being opened responsively to said control signal and further including an input circuit for closing said output circuit responsively to reception of said output signal, input signal means electrically connected to said second switch means for providing said input signal to said first switch means and including second energy storage means for providing said input signal in accordance with a change in its energy storage condition and for changing its energy storage condition responsively to said second switch means being opened.

4. An electrical actuating circuit operable for controlling the successive application of an electrical potential from a source to successive circuits responsively to successive trigger signals comprising control circuit means for providing a control signal responsively to the reception of each trigger signal, a plurality of asymmetric switch means each being individual with one of the successive circuits for conducting current thereto from the source and each including a normally opened output circuit electrically connected to the source for conducting current therefrom upon being closed and electrically connected to said control means for being opened responsively to said control signal and each further including an input circuit for closing said output circuit with which it is individual responsively to the application of an output signal, a plurality of output signal means each electrically connected to said output circuit of one of said plurality of switch means for providing said output signal responsively to said output circuit with which it is individual being opened, each of said output signal means being connected to said input circuit of the succeeding one of said switch means with said last of said output signal means of said pluralty of said asymmetric switch means being connected to said input circuit of the first of said plurality of asymmetric switch means.

5. An electrical counter circuit operable with a source of potential for tabulating the occurrence of successive trigger signals comprising a plurality of successively interconnected counter stages, each of said counter stages including control circuit means for providing a control signal responsively to the reception of a trigger pulse signal with said control circuit means for the first of said counter stages being responsive to the reception of each trigger signal, a plurality of counter indicator means for providing an indication of the total number of trigger signals received upon being connected to the source in a preselected sequence, a plurality of asymmetric switch means each having a normally opened output circuit electrically connected to one of said indicator means and to the source for connecting said one of said indicator means to the source upon being closed and being electrically connected to said control means for being opened responsively to said control signal, each of said asymmetric switch means having an input circuit operable for closing said output circuit of that one of said plurality of asymmetric switch means with which it is individual responsively to an input signal, each of a plurality of output signal means electrically connected to one of said output circuits of said asymmetric switch means for providing an output signal responsively to said one of said output circuits being opened and being electrically connected to said input circuit of the succeeding one of said asymmetric switch means with the last of said output signal means of said plurality of said asymmetric switch means in each of said counter stages being connected to said input circuit of the first of said plurality of asymmetric switch means and with each of said last of said output signal means of the previous ones of said counter stages being electrically connected to said control circuit means of the succeeding one of said counter stages for providing a trigger pulse signal to said succeeding one of said counter stages responsively to the occurrence of said output signal in said each of said last of said output signal means.

6. The counter circuit of claim 5 further including a plurality of connecting circuit means each electrically interconnecting successive ones of said counter stages and each including a diode electrically connecting said last of said output signal means to said control circuit means of said succeeding one of said counter stages and further including means for biasing said diode for rendering said diode conductive for potential differences exceeding a predetermined magnitude.

7. An electrical actuating circuit operable responsively to a trigger signal comprising control circuit means for providing a control signal responsively to reception of the trigger signal, first electrical circuit means electrically connected to said control circuit means and being placed in one condition responsively to reception of the control signal and in another condition responsively to reception of an input signal, output signal means electrically connected to said first electrical circuit means for providing an output signal responsively to said electrical circuit means being placed in said one condition, second electrical circuit means electrically connected to said output signal means and to said control signal means and being placed in a first condition responsively to reception of said control signal and in a second condition responsively to reception of said output signal, input signal means electrically connected to said second electrical circuit means for providing said input signal to said first electrical circuit means responsively to said second electrical circuit means being placed in said first condition.

8. An electrical actuating circuit operable responsively to a trigger signal comprising control circuit means for providing a control signal responsively to reception of the trigger signal, first electrical circuit means electrically connected to said control circuit means and being placed in one condition responsively to reception of the control signal and in another condition responsively to reception of an input signal, output signal means electrically connected to said first electrical circuit means for providing an output signal and including first energy storage means for providing said output signal in accordance with a change in its energy storage condition and for changing its energy storage condition responsively to said electrical circuit means being placed in said one condition, second electrical circuit means electrically connected to said output signal means and to said control signal means and being placed in a first condition responsively to reception of said control signal and in a second condition responsively to reception of said output signal, input signal means electrically connected to said second electrical circuit means for providing said input signal to said first electrical circuit means and including second energy storage means for providing said input signal in accordance with a change in its energy storage condition and for changing its energy storage condition responsively to said second electrical circuit means being placed in said first condition.

9. An electrical actuating circuit operable for controlling the successive application of an electrical potential from a source to successive circuits responsively to successive trigger signals comprising a plurality of controlled rectifiers each having a pair of normally non-conductive principal electrodes connected to the source for conducting current to that one of the successively actuable circuits with which it is individual upon being rendered conductive and for continuing to conduct until the potential difference across said principal electrodes is substantially zero and each of said rectifiers having a gate electrode electrically operative with said principal electrodes for rendering said principal electrodes conductive upon conduction of current through said gate electrode of at least a minimum magnitude, each of a plurality of capacitors individual to one of said plurality of controlled rectifiers, discharge circuit means connecting each of said capacitors across said principal electrodes of that one of said controlled rectifiers with which it is individual for discharging said capacitor when said principal electrodes are conductive, charge circuit means connecting each of said plurality of capacitors to the source of potential when said principal electrodes of that one of said controlled rectifiers with which it is individual are non-conductive, said charge circuit means including circuit means for electrically connecting each of said capacitors to said gate electrode of the succeeding one of said controlled rectifiers and for electrically connecting that one of said capacitors of the last of said controlled rectifiers to said gate electrode of the first of said controlled rectifiers and being responsive to the flow of charge current having a magnitude exceeding a predetermined minimum to each of said capacitors for causing current flow of said minimum magnitude to that one of said gate electrodes with which each of said capacitors is individual, control circuit means electrically connected to said principal electrodes of each of said plurality of controlled rectifiers for reducing the potential difference across said principal electrodes to substantially zero responsively to the reception of each trigger signal.

10. The electrical actuating circuit of claim 9 further including reset circuit means electrically connected to said plurality of controlled rectifiers and to said plurality of capacitors and being selectively operable for rendering the potential difference across said principal electrodes of each of said controlled rectifiers to substantially zero and for completing a discharge circuit to said one of said capacitors of said last of said controlled rectifiers and for completing a charge circuit to the remaining ones of said capacitors.

11. The electrical actuating circuit of claim 9 further including a temperature compensating circuit electrically connected to said plurality of controlled rectifiers.

12. An electrical actuating circuit operable for controlling the successive application of an electrical potential from a source to successive circuits responsively to successive trigger signals comprising a plurality of controlled rectifiers each having a pair of normally non-conductive principal electrodes connected to the source for conducting current to that one of the successively actuable circuits with which it is individual upon being rendered conductive and for continuing to conduct until the potential difference across said principal electrodes is substantially zero and each of said rectifiers having a gate electrode electrically operative with said principal electrodes for rendering said principal electrodes conductive upon conduction of current through said gate electrode of at least a minimum magnitude, each of a plurality of capacitors individual to one of said plurality of controlled rectifiers, discharge circuit means connecting each of said capacitors across said prinicpal electrodes of that one of said controlled rectifiers with which it is individual for discharging said capacitor through said principal electrodes when said principal electrodes are conductive, said discharge circuit means including a plurality of diodes each serially connected to one of said plurality of capacitors, charge circuit means connecting each of said plurality of capacitors to the source of potential when said principal electrodes of that one of said controlled rectifiers with which it is individual are non-conductive, said charge circuit means including circuit means for electrically connecting each of said capacitors to said gate electrode of the succeeding one of said controlled rectifiers and for electrically connecting that one of said capacitors of the last of said controlled rectifiers to said gate electrode of the first of said controlled rectifiers and being responsive to the flow of charge current having a magnitude exceeding a predetermined minimum to each of said capacitors for causing current flow of at least said minimum magnitude to that one of said gate electrodes with which said each of said capacitors is individual, said last named circuit means including a plurality of diodes each serially connected to one of said plurality of capacitors and a plurality of resistors each connected to one of said plurality of diodes and to said gate electrode with which said one of said capacitors is individual, control circuit means electrically connected to said principal electrodes of each of said plurality of controlled rectifiers for reducing the potential difference across said principal electrodes to substantially zero responsively to the reception of each trigger signal.

13. The electrical actuating circuit of claim 12 further including reset circuit means comprising a switch electrically connected to said plurality of controlled rectifiers and to said plurality of capacitors and being selectively operable in accordance with actuation of said switch for rendering the potential difference across said principal electrodes of each of said controlled rectifiers to substantially zero and for completing a discharge circuit to said one of said capacitors of said last of said controlled rectifiers and for completing a charge circuit to the remaining ones of said capacitors, said reset circuit means further comprising a diode in said discharge circuit being electrically connected to said switch and a plurality of diodes in said charge circuit individual to each of said remaining ones of said capacitors and each being electrically connected to said switch.

14. An electrical actuating circuit operable for controlling the successive application of an electrical potential from a source to successive circuits responsively to successive trigger signals comprising a plurality of controlled rectifiers each having a pair of normally non-conductive principal electrodes connected to the source for conducting current to that one of the successively actuable circuits with which it is individual upon being rendered conductive and for continuing to conduct until the potential difference across said principal electrodes is substantially zero and each of said rectifiers having a gate electrode electrically operative with said principal electrodes for rendering said principal electrodes conductive upon conduction of current of at least a minimum magnitude, each of a plurality of capacitors individual to one of said plurality of controlled rectifiers, discharge circuit means connecting each of said capacitors across said principal electrodes of that one of said controlled rectifiers with which it is individual for discharging said capacitor through said principal electrodes when said principal electrodes are conductive, said discharge circuit means including a plurality of diodes each serially connected to one of said plurality of capacitors, charge circuit means connecting each of said plurality of capacitors to the source of potential when said principal electrodes of that one of said controlled rectifiers with which it is individual are non-conductive, said charge circuit means including circuit means for electrically connecting each of said capacitors to said gate electrode of the succeeding one of said controlled rectifiers and for electrically connecting that one of said capacitors of the last of said controlled rectifiers to said gate electrode of the first of said controlled rectifiers and being responsive to the flow of charge current having a magnitude exceeding a predetermined minimum to each of said capacitors for causing current flow of at least said minimum magnitude to that one of said gate electrodes with which said each of said capacitors is individual, said circuit means including a plurality of diodes each serially connected to one of said plurality of capacitors and a plurality of resistors each connected to one of said plurality of diodes and to said gate electrode with which said one of said capacitors is individual, control circuit means comprising a first electric valve member having an input circuit for receiving each trigger signal and having an output circuit for providing an output signal responsively to each trigger signal, and a second electric valve having an input circuit connected to said output circuit of said first valve and having an output circuit connected to said principal electrodes for reducing the potential across said principal electrodes to substantially zero responsively to said output signal from said first valve.

15. An electrical actuating circuit operable for controlling the successive application of an electrical potential from a source to successive circuits responsively to successive trigger signals comprising a plurality of controlled rectifiers each having a pair of normally non-conductive principal electrodes connected to the source for conducting current to that one of the successively actuable circuits with which it is individual upon being rendered conductive and for continuing to conduct until the potential difference across said principal electrodes is substantially zero and each of said rectifiers having a gate electrode electrically operative with said principal electrodes for rendering said principal electrodes conductive upon conduction of current of at least a minimum magnitude, each of a plurality of capacitors individual to one of said plurality of controlled rectifiers, discharge circuit means connecting each of said capacitors across said principal electrodes of that one of said controlled rectifiers with which it is individual for discharging said capacitor through said principal electrodes when said principal electrodes are conductive, said discharge circuit means including a plurality of diodes each serially connected to one of said plurality of capacitors, charge circuit means connecting each of said plurality of capacitors to the source of potential when said principal electrodes of that one of said controlled rectifiers with which it is individual are non-conductive, said charge circuit means including circuit means for electrically connecting each of said capacitors to said gate electrode of the succeeding one of said controlled rectifiers and for electrically connecting that one of said capacitors of the last of said controlled rectifiers to said gate electrode of the first of said controlled rectifiers and being responsive to the flow of charge current having a magnitude exceeding a predetermined minimum to each of said capacitors for causing current flow of at least said minimum magnitude to that one of said gate electrodes with which said each of said capacitors is individual, said circuit means including a plurality of diodes each serially connected to one of said plurality of capacitors and a plurality of resistors each connected to one of said plurality of diodes and to said gate electrode with which said one of said capacitors is individual, control circuit means comprising a first electric valve having a normally non-conductive output circuit and an input circuit for receiving each trigger signal and for rendering said output circuit conductive responsively to each trigger signal, and a second electric valve having a normally conducting output circuit electrically connected to said principal electrodes for reducing the potential difference across said principal electrodes to substantially zero upon being rendered non-conductive and an input circuit electrically connected to said output circuit of said first electric valve for rendering said output circuit of said second electric valve non-conductive responsively to said output circuit of said first electric valve being rendered conductive.

16. An electrical actuating circuit operable for controlling the successive application of an electrical potential from a source responsively to successive trigger signals comprising a plurality of electrical indicating means being actuable for providing an indication, a plurality of controlled rectifiers each having a pair of normally non-conductive principal electrodes connected to the source and to individual ones of said indicating means for conducting current to successive ones of said indicating means with which it is individual upon being rendered conductive and for continuing to conduct until the potential difference across said principal electrodes is substantially zero and each of said rectifiers having a gate electrode electrically operative with said principal electrodes for rendering said principal electrodes conductive upon conduction of current of at least a minimum magnitude, each of a plurality of capacitors individual to one of said plurality of controlled rectifiers, discharge circuit means connecting each of said capacitors across said principal electrodes of that one of said controlled rectifiers with which it is individual for discharging said capacitor through said principal electrodes when said principal electrodes are conductive, said discharge circuit means including a plurality of diodes each serially connected to one of said plurality of capacitors, charge circuit means connecting each of said plurality of capacitors to said source of potential through that one of said indicating means associated with that one of said controlled rectifiers with which it is individual when said principal electrodes of said one of said controlled rectifiers are nonconductive, said charge circuit means including circuit means for electrically connecting each of said capacitors to said gate electrode of the succeeding one of said controlled rectifiers and for electrically connecting that one of said capacitors of the last of said controlled rectifiers to said gate electrode of the first said controlled rectifiers and being responsive to flow of charge current having a magnitude exceeding a predetermined minimum to each of said capacitors for causing current flow of said minimum magnitude to that one of said gate electrodes with which said each of said capacitors is individual, said circuit means including a plurality of diodes each serially connected to one of said plurality of capacitors and a plurality of resistors each connected to one of said plurality of diodes and to said gate electrode with which said one of said capacitors is individual, control circuit means electrically connected to said principal electrodes of each of said plurality of controlled rectifiers for reducing the potential difference across said principal electrodes to substantially zero responsively to the reception of each trigger signal.

17. The electrical circuit of claim 16 in which said plurality of indicating means includes ten lights for providing a numeral indication from 0–9.

18. An electrical counter circuit operable with a source of potential for tabulating the occurrence of successive trigger signals comprising a plurality of successively interconnected counter stages, each of said counter stages including a plurality of electrical indicating means being actuable for providing a numerical indication in accordance with the number of successive trigger signals occurring, a plurality of controlled rectifiers each having a pair of normally nonconductive principal electrodes connected to the source and to individual ones of said indicating means for conducting current to successive ones of said indicating means with which it is individual upon being rendered conductive and for continuing to conduct until the potential difference across said principal electrodes is substantially zero, each of said controlled rectifiers having a gate electrode electrically operative with said principal electrodes for rendering said principal electrodes conductive upon conduction of current through said gate electrode of at least a minimum magnitude, each of a plurality of capacitive circuits being individual to one of said plurality of controlled rectifiers, discharge circuit means connecting each of said capacitive circuits across said principal electrodes of that one of said controlled rectifiers with which it is individual for discharging each of said capacitive circuits when said principal electrodes of said one of said controlled rectifiers are conductive, charge circuit means connecting each of said plurality of capacitive circuits to the source of potential for charging each of said capacitive circuits when said principal electrodes of said one of said controlled rectifiers are nonconductive, said charge circuit means including circuit means for electrically connecting each of said capacitive circuits to said gate electrode of the succeeding one of said controlled rectifiers and for electrically connecting that one of said capacitive circuits of the last of said controlled rectifiers to said gate electrode of the first of said controlled rectifiers and being responsive to the flow of charge current having a magnitude exceeding a predetermined minimum to each of said capacitive circuits for causing current flow of said minimum magnitude to that one of said gate electrodes with which each of said capacitive circuits is individual, control circuit means electrically connected to said principal electrodes of each of said plurality of controlled rectifiers for reducing the potential difference across said principal electrodes responsively to the reception of a trigger pulse signal with said control circuit means for said first stage being responsive to the reception of each trigger signal and with said control circuit means of succeeding ones of said stages being responsive to the flow of charge current to that one of said capacitive circuits individual to said last of said controlled rectifiers of the previous one of said stages for providing said trigger pulse signal to said control circuit means of the succeeding one of said plurality of stages.

19. An electrical counter circuit operable with a source of potential for tabulating the occurrence of successive trigger signals comprising a plurality of successively interconnected counter stages, each of said counter stages including a plurality of electrical indicating means being actuable for providing a numerical indication in accordance with the number of successive trigger signals occurring, a plurality of controlled rectifiers each having a pair of normally non-conductive principal electrodes connected to the source and to individual ones of said indicating means for conducting current to successive ones of said indicating means with which it is individual upon being rendered conductive and for continuing to conduct until the potential difference across said principal electrodes is substantially zero, each of said controlled rectifiers having a gate electrode electrically operative with said principal electrodes for rendering said principal electrodes conductive upon conduction of current through said gate electrode of at least a minimum magnitude, each of a plurality of capacitive circuits being individual to one of said plurality of controlled rectifiers, discharge circuit means connecting each of said capacitive circuits across said principal electrodes of that one of said controlled rectifiers with which it is individual for discharging each of said capacitive circuits when said principal electrodes of said one of said controlled rectifiers are conductive, said discharge circuit means including a plurality of diodes each serially connected to one of said plurality of capacitive circuits, charge circuit means connecting each of said plurality of capacitive circuits to the source of potential for charging each of said capacitive circuits when said principal electrodes of said one of said controlled rectifiers are non-conductive, said charge circuit means including circuit means for electrically connecting each of said capacitive circuits to said gate electrode of the succeeding one of said controlled rectifiers and for electrically connecting that one of said capacitive circuits of the last of said controlled rectifiers to said gate electrode of the first of said controlled rectifiers and being responsive to the flow of charge current having a magnitude exceeding a predetermined minimum to each of said capacitive circuits for causing current flow of said minimum magnitude to that one of said gate electrodes with which each of said capacitive circuits is individual, said circuit means including a plurality of diodes each serially connected to one of said plurality of capacitive circuits and a plurality of resistors each connected to one said plurality of diodes and to said gate electrode with which said one of said capacitive circuits is individual; reset circuit means comprising a switch electrically connected to said plurality of controlled rectifiers and to said plurality of capacitive circuits and being selectively operable in accordance with actuation of said switch for rendering the potential difference across said principal electrodes of each of said controlled rectifiers to substantially zero and for completing a discharge circuit to said one of said capacitive circuits of said last of said controlled rectifiers and for completing a charge circuit to the remaining ones of said capacitive circuits, said reset circuit means further comprising a diode in said discharge circuit being electrically connected to said switch and a plurality of diodes in said charge circuit individual to each of said remaining ones of said capacitive circuits and each being electrically connected to said switch; control circuit means electrically connected to said principal electrodes of each of said plurality of controlled rectifiers for reducing the potential difference across said principal electrode responsively to the reception of a trigger pulse signal with said control circuit means for the first of said stages being responsive to the reception of each trigger signal and with said control circuit means of succeeding ones of said stages being responsive to the flow of charge current to that one of said capacitive circuits individual to said last of said controlled rectifiers of the previous one of said stages for providing said trigger pulse signal to said control circuit means of the succeeding one of said plurality of stages.

20. An electrical counter circuit operable with a source of potential for tabulating the occurrence of successive trigger signals comprising a plurality of successively interconnected counter stages, each of said counter stages including a plurality of electrical indicating means being actuable for providing a numerical indication in accordance with the number of successive trigger signals occurring, a plurality of controlled rectifiers each having a pair of normally nonconductive principal electrodes connected to the source and to individual ones of said indicating means for conducting current to successive ones of said indicating means with which it is individual upon being rendered conductive and for continuing to conduct until the potential difference across said principal electrodes is substantially zero, each of said controlled rectifiers having a gate electrode electrically operative with said principal electrodes for rendering said principal electrodes conductive upon conduction of current through said gate electrode of at least a minimum magnitude, each of a plurality of capacitive circuits being individual to one of said plurality of controlled rectifiers, discharge circuit means connecting each of said capacitive circuits across said principal electrodes of that one of said controlled rectifiers with which it is individual for discharging each of said capacitive circuits when said principal electrodes of said one of said controlled rectifiers are conductive, said discharge circuit means including a plurality of diodes each serially connected to one of said plurality of capacitive circuits, charge circuit means connecting each of said plurality of capacitive circuits to the source of potential for charging each of said capacitive circuits when said principal electrodes of said one of said controlled rectifiers are nonconductive, said charge circuit means including circuit means for electrically connecting each of said capacitive circuits to said gate electrode of the succeeding one of said controlled rectifiers and for electrically connecting that one of said capacitive circuits of the last of said controlled rectifiers to said gate electrode of the first of said controlled rectifiers and being responsive to the flow of charge current having a magnitude exceeding a predetermined minimum to each of said capacitive circuits for causing current flow of said minimum magnitude to that one of said gate electrodes with which each of said capacitive circuits is individual, said circuit means including a plurality of diodes each serially connected to one of said plurality of capacitive circuits and a plurality of resistors each connected to one said plurality of diodes and to said gate electrode with which said one of said capacitive circuits is individual; reset circuit means comprising a switch electrically connected to said plurality of controlled rectifiers and to said plurality of capacitive circuits and being selectively operable in accordance with actuation of said switch for rendering the potential difference across said principal electrodes of each of said controlled rectifiers to substantially zero and for completing a discharge circuit to said one of said capacitive circuits of said last of said controlled rectifiers and for completing a charge circuit to the remaining ones of said capacitive circuits, said reset circuit means further comprising a diode in said discharge circuit being electrically connected to said switch and a plurality of diodes in said charge circuit individual to each of said remaining ones of said capacitive circuits and each being electrically connected to said switch; control circuit means comprising a first electric valve having a normally non-conductive output circuit and an input circuit for receiving a trigger pulse signal and for rendering said output circuit conductive responsively to each trigger signal and a second electric valve having a normally conducting output circuit electrically connected to said principal electrodes for reducing the potential difference across said principal electrodes to substantially zero upon being rendered non-conductive and an input circuit electrically connected to said output circuit of said first electric valve for rendering said output circuit of said second electric valve non-conductive responsively to said output circuit of said first electric valve being rendered conductive, said control circuit means of the first of said stages being responsive to the reception of each trigger signal and said control circuit means of succeeding stages being responsive to the flow of charge current to that one of said capacitive circuits individual to said last of said controlled rectifiers of the previous one of said stages for providing said trigger pulse signal to said control circuit means of the succeeding one of said plurality of stages.

21. An electrical counter circuit operable with a source of potential for tabulating the occurrence of successive trigger signals comprising a plurality of successively interconnected counter stages, each of said counter stages including a plurality of electrical indicating means being actuable for providing a numerical indication in accordance with the number of successive trigger signals occurring, a plurality of controlled rectifiers each having a pair of normally nonconductive principal electrodes connected to the source and to individual ones of said indicating means for conducting current to successive ones of said indicating means with which it is individual upon being rendered conductive and for continuing to conduct until the potential difference across said principal electrodes is substantially zero, each of said controlled rectifiers having a gate electrode electrically operative with said principal electrodes for rendering said principal electrodes conductive upon conduction of current through said gate electrode of at least a minimum magnitude, each of a plurality of capacitive circuits being individual to one of said plurality of controlled rectifiers, discharge circuit means connecting each of said capacitive circuits across said principal electrodes of that one of said controlled rectifiers with which it is individual for discharging each of said capacitive circuits when said principal electrodes of said one of said controlled rectifiers are conductive, said discharge circuit means including a plurality of diodes each serially connected to one of said plurality of capacitive circuits, charge circuit means connecting each of said plurality of capacitive circuits to the source of potential for charging each of said capacitive circuits when said principal electrodes of said one of said controlled rectifiers are nonconductive, said charge circuit means including circuit means for electrically connecting each of said capacitive circuits to said gate electrode of the succeeding one of said controlled rectifiers and for electrically connecting that one of said capacitive circuits of the last of said controlled rectifiers to said gate electrode of the first of said controlled rectifiers and being responsive to the flow of charge current having a magnitude exceeding a predetermined minimum to each of said capacitive circuits for causing current flow of said minimum magnitude to that one of said gate electrodes with which each of said capacitive circuits is individual, said circuit means including a plurality of diodes each serially connected to one of said plurality of capacitive circuits and a plurality of resistors each connected to one said plurality of diodes and to said gate electrode with which said one of said capacitive circuits is individual; reset circuit means comprising a switch electrically connected to said plurality of controlled rectifiers and to said plurality of capacitive circuits and being selectively operable in accordance with actuation of said switch for rendering the potential difference across said principal electrodes of each of said controlled rectifiers to substantially zero and for completing a discharge circuit to said one of said capacitive circuits of said last of said controlled rectifiers and for completing a charge circuit to the remaining ones of said capacitive circuits, said reset circuit means further comprising a diode in said discharge circuit being electrically connected to said switch and a plurality of diodes in said charge circuit individual to each of said remaining ones of said capacitive circuits and each being electrically connected to said switch; control circuit means comprising a first electric valve having a normally non-conductive output circuit and an input circuit for receiving a trigger pulse signal and for rendering said output circuit conductive responsively to each trigger signal and a second electric valve having a normally conducting output circuit electrically connected to said principal electrodes for reducing the potential difference across said principal electrodes to substantially zero upon being rendered nonconductive and an input circuit electrically connected to said output circuit of said first electric valve for rendering said output circuit of said second electric valve nonconductive responsively to said output circuit of said first electric valve being rendered conductive, said control circuit means of the first of said stages being responsive to the reception of each trigger signal and said control circuit means of succeeding stages being responsive to the flow of charge current to that one of said capacitive circuits individual to said last of said controlled rectifiers of the previous one of said stages for providing said trigger pulse signal to said control circuit means of the succeeding one of said plurality of stages, and connecting circuit means for electrically interconnecting successive ones of said stages comprising a diode electrically connecting said principal electrodes of said last of said controlled rectifiers in prior ones of said stages to said control circuit means of succeeding ones of said stages and further including means for biasing said diode for rendering said diode conductive for potential differences exceeding a predetermined magnitude.

22. An electrical actuating circuit operable for controlling the successive application of an electrical potential from a source to successive circuits responsively to successive trigger signals comprising a plurality of controlled rectifiers each being individual to one of the successive circuits and each having a normally nonconductive anode and cathode with said anode being connected to the positive side of the source of potential through that one of the successive circuits with which it is individual and with said anode and said cathode of each of said controlled rectifiers upon being rendered conductive continuing to conduct until the potential difference thereacross is substantially zero and each of said controlled rectifiers having a gate electrode electrically operative with said anode and said cathode for rendering said anode and said cathode conductive upon conduction of current of at least a minimum magnitude from said gate electrode through said cathode electrode, each of a plurality of capacitors individual to one of said plurality of controlled rectifiers and having one side directly connected to said anode, a plurality of diodes each being individual to one of said plurality of capacitors and with each of said diodes having its cathode connected to the other side of that one of said capacitors with which it is individual and having its anode electrode connected to ground potential through a resistive circuit, each of a second plurality of diodes being individual to one of said plurality of capacitors and having an anode electrode connected to said other side of said one of said capacitors and having its cathode connected to said gate electrode of the succeeding one of said controlled rectifiers and connected to ground potential through a resistive circuit, control means electrically connected to said cathodes of said controlled rectifiers for reducing the potential difference between said anode and said cathode of said controlled rectifiers to substantially zero responsively to the reception of each trigger signal.

23. An electrical actuating circuit operable for controlling the successive application of an electrical potential from a source to successive circuits responsively to successive trigger signals comprising a plurality of controlled rectifiers each being individual to one of the successive circuits and each having a normally nonconductive anode and cathode with said anode being connected to the positive side of the source of potential through that one of the successive circuits with which it is individual and with said anode and said cathode of each of said controlled rectifiers upon being rendered conductive continuing to conduct until the potential difference thereacross is substantially zero and each of said controlled rectifiers having a gate electrode electrically operative with said anode and said cathode for rendering said anode and said cathode conductive upon conduction of current of at least a minimum magnitude from said gate electrode through said cathode electrode, each of a plurality of capacitors individual to one of said plurality of controlled rectifiers and have one side directly connected to said anode, a plurality of diodes each being individual to one of said plurality of capacitors and with each of said diodes having its cathode connected to the other side of that one of said capacitors with which it is individual and having its anode electrode connected to ground potential through a resistive circuit, each of a second plurality of diodes being individual to one of said plurality of capacitors and having an anode electrode connected to said other side of said one of said capacitors and having its cathode connected to said gate electrode of the succeeding one of said controlled rectifiers and connected to ground potential through a resistive circuit, control circuit means comprising a first electric valve having a normally nonconductive output circuit and an input circuit for receiving the trigger signals and for rendering said output circuit conductive responsively to each trigger signal and a second electric valve having a normally conductive output circuit electrically connected to each said cathode for reducing the potential difference across each said anode and said cathode to substantially zero upon being rendered nonconductive and an input circuit electrically connected to said output circuit of said first electric valve for rendering said output circuit of said second electric valve nonconductive responsively to said output circuit of said first electric valve being rendered conductive.

24. An electrical actuating circuit operable for controlling the successive application of an electrical potential from a source to successive circuits responsively to successive trigger signals comprising a plurality of controlled rectifiers each being individual to one of the successive circuits and each having a normally nonconductive anode and cathode with said anode being connected to the positive side of the source of potential through that one of the successive circuits with which it is individual and with said anode and said cathode of each of said controlled rectifiers upon being rendered conductive continuing to conduct until the potential difference thereacross is substantially zero and each of said controlled rectifiers having a gate electrode electrically operative with said anode and said cathode for rendering said anode and said cathode conductive upon conduction of current of at least a minimum magnitude from said gate electrode through said cathode electrode, each of a plurality of capacitors individual to one of said plurality of controlled rectifiers and having one side directly connected to said anode, a plurality of diodes each being individual to one of said plurality of capacitors and with each of said diodes having its cathode connected to the other side of that one of said capacitors with which it is individual and having its anode electrode connected to ground potential through a resistive circuit, each of a second plurality of diodes being individual to one of said plurality of capacitors and having an anode electrode connected to said other side of said one of said capacitors and having its cathode connected to said gate electrode of the succeeding one of said controlled rectifiers and connected to ground potential through a resistive circuit, control circuit means comprising a first electric valve having a normally nonconductive output circuit and an input circuit for receiving the trigger signals and for rendering said output circuit conductive responsively to each trigger signal and a second electric valve having a normally conductive output circuit electrically connected to each said cathode for reducing the potential difference across each said anode and said cathode to substantially zero upon being rendered nonconductive and an input circuit electrically connected to said output circuit of said first electric valve for rendering said output circuit of said second electric valve nonconductive responsively to said output circuit of said first electric valve being rendered conductive, and reset circuit means comprising a switch electrically connected to said control circuit means and to said plurality of capacitors and being selectively operable in accordance with actuation of said switch for rendering said output circuit of said second valve nonconductive and for completing a discharge circuit to that one of said plurality of capacitors of the last of said controlled rectifiers and for completing a charge circuit to the remaining ones of said capacitors, said reset circuit means further comprising a diode in said discharge circuit having its anode connected to said other side of said one of said capacitors and having its cathode connected to said switch and a plurality of diodes in said charge circuit individual to each of said remaining ones of said capacitors and each having its anode connected to said one side of that one of said capacitors with which it is individual and having its cathode connected to said switch.

References Cited by the Examiner

UNITED STATES PATENTS

| | | | |
|---|---|---|---|
| 2,714,180 | 7/1955 | Manley | 315—166 |
| 2,719,227 | 9/1955 | Gordon | 235—92 |
| 2,758,250 | 8/1956 | Ridler et al. | 315—84.5 |

MALCOLM A. MORRISON, *Primary Examiner*.